United States Patent
Yu

(10) Patent No.: US 12,389,659 B2
(45) Date of Patent: Aug. 12, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Yexiao Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 729 days.

(21) Appl. No.: 17/648,714

(22) Filed: Jan. 24, 2022

(65) Prior Publication Data

US 2022/0320302 A1  Oct. 6, 2022

Related U.S. Application Data

(63) Continuation of application No. PCT/CN2021/106660, filed on Jul. 16, 2021.

(30) Foreign Application Priority Data

Mar. 31, 2021  (CN) .......................... 202110351086.2

(51) Int. Cl.
*H10D 64/27* (2025.01)
*H01L 21/768* (2006.01)
*H10D 64/01* (2025.01)

(52) U.S. Cl.
CPC ..... *H10D 64/513* (2025.01); *H01L 21/76895* (2013.01); *H10D 64/01* (2025.01)

(58) Field of Classification Search
CPC ...... H10B 12/34; H10B 12/00; H10B 12/488; H10B 12/053; H10B 12/30; H10B 12/50; H01L 29/4236; H01L 21/76895; H01L 21/743; H10D 64/512; H10D 64/01
See application file for complete search history.

(56) References Cited

U.S. PATENT DOCUMENTS

| | | | |
|---|---|---|---|
| 7,554,150 B2 | 6/2009 | Min | |
| 2008/0042186 A1 | 2/2008 | Min | |
| 2019/0097008 A1* | 3/2019 | Yanagigawa | H01L 29/41741 |
| 2019/0206877 A1* | 7/2019 | Kim | H10B 63/30 |

FOREIGN PATENT DOCUMENTS

| | | | | |
|---|---|---|---|---|
| CN | 107134486 A | | 9/2017 | |
| CN | 109119330 A | * | 6/2019 | ......... H01L 21/0332 |
| CN | 211350646 U | | 8/2020 | |
| CN | 211350647 U | | 8/2020 | |
| CN | 113097149 A | | 7/2021 | |

* cited by examiner

*Primary Examiner* — Britt D Hanley
*Assistant Examiner* — Jason James Greaving
(74) *Attorney, Agent, or Firm* — Syncoda LLC; Feng Ma

(57) ABSTRACT

A method for manufacturing a semiconductor structure includes: providing a substrate; forming a gate trench in the substrate, the gate trench including a first trench and a second trench, the second trench being located above the first trench, communicating with the first trench, and having a width greater than a width of the first trench; and forming a gate word line in the gate trench.

7 Claims, 19 Drawing Sheets

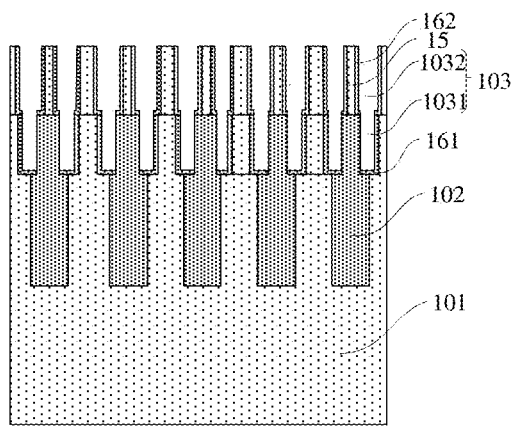
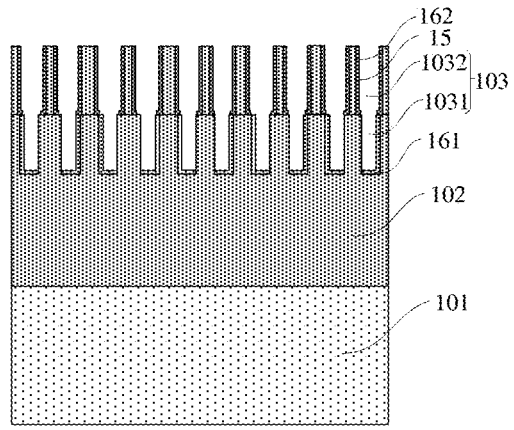
FIG. 14A
FIG. 14B

SEMICONDUCTOR STRUCTURE AND METHOD FOR MANUFACTURING SAME

CROSS-REFERENCE TO RELATED APPLICATIONS

This is a continuation of International Application No. PCT/CN2021/106660 filed on Jul. 16, 2021, which claims priority to China Patent Application No. 202110351086.2 filed on Mar. 31, 2021. The disclosures of the above-referenced applications are hereby incorporated by reference in their entirety.

BACKGROUND

Dynamic storages are developing towards high speed, high integration density, low power consumption, etc. With the miniaturization of the structural size of semiconductor devices, the size of a gate word line is miniaturized, especially in a process for manufacturing Dynamic Random Access Memory (DRAM) with a key size less than 20 nm.

SUMMARY

The disclosure relates generally to the technical field of integrated circuits, and more specifically to a semiconductor structure and a method for manufacturing the same.

According to some embodiments of the present disclosure, a semiconductor structure and a method for manufacturing the same are provided.

A method for manufacturing a semiconductor structure includes the following operations.

A substrate is provided.

A gate trench is provided in the substrate. The gate trench includes a first trench and a second trench. The second trench is located above the first trench, communicates with the first trench, and has a width greater than a width of the first trench.

A gate word line is formed in the gate trench.

A semiconductor structure includes: a substrate; a gate trench located in the substrate and including a first trench and a second trench, and a gate word line located in the gate trench. The second trench is located above the first trench, communicated with the first trench, and has a width greater than a width of the first trench.

The descriptions only summarize the technical solutions of this disclosure. To know the technical means of this disclosure more clearly, and implement according to the contents of the description, the following will describe by combining preferred embodiments of this disclosure and the brief description of the drawings.

BRIEF DESCRIPTION OF THE DRAWINGS

In order to describe the technical solutions in the embodiments of the present disclosure or in the related art more clearly, drawings required to be used in the embodiments or the illustration of the traditional technology will be briefly introduced below. Apparently, the drawings in the description below are only some examples of the disclosure. Those ordinarily skilled in the art also can acquire other drawings according to the provided drawings without creative work.

FIG. 14A schematically shows the cross section of an array region of a structure obtained after a second oxide layer is formed in a method for manufacturing the semiconductor structure provided by an embodiment of the disclosure.

FIG. 14B schematically shows the cross section of an edge region of a structure obtained after a second oxide layer is formed in a method for manufacturing the semiconductor structure provided by an embodiment of the disclosure.

DETAILED DESCRIPTION

Figure 1:
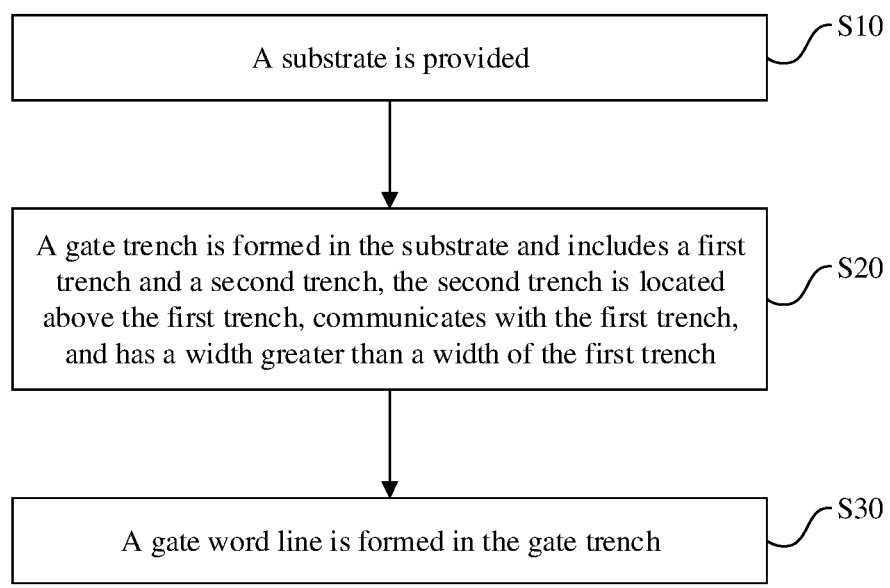
FIG. 1 shows a flowchart of a method for manufacturing a semiconductor structure provided by an embodiment of the disclosure.

For convenience of an understanding of the present disclosure, the embodiments of the disclosure will be described more fully below with reference to the related accompanying drawings. Preferred embodiments of the present disclosure are shown in the accompanying diagrams. The present disclosure may, however, be embodied in many different forms which are not limited to the embodiments described herein. Rather, these embodiments are provided so that the disclosed content of the present disclosure will be more thorough and complete.

Unless defined otherwise, all technical and scientific terms used herein have the same meaning as commonly understood by those skilled in the art to which the present disclosure belongs. The terms used herein in the specification of the present disclosure are for the purpose of describing specific embodiments only and are not intended to be limiting of the present disclosure. The term "and/or" used herein covers any and all combinations of one or more related listed items.

In the description of the embodiments of the present disclosure, it should be noted that orientations or positional relationships indicated by the terms "upper", "lower", "vertical", "horizontal", "inside", "outside" and the like are orientations or positional relationships as shown in the drawings, and are only for the purpose of facilitating and simplifying the description of the embodiments of the present disclosure instead of indicating or implying that devices or elements indicated must have particular orientations, and be constructed and operated in the particular orientations. Therefore, these terms cannot be explained as limitation on the present disclosure.

The quality of DRAM in aspects of electrical properties can be directly determined by a contact resistance between the gate word line and a conductive interconnecting structure. The magnitude of the current and the delay time of the signal are directly determined by the resistance of the connection. Especially, for the gate word line, the magnitude and stability of the current signal directly determine the storage speed and storage efficiency of a device.

In some implementations, the gate word line has a relatively small width at the top. During the formation of an interconnecting through hole electrically connected to the gate word line, the offset of photolithography alignment or the offset in a pattern transfer process will cause the formed interconnecting structure to be shifted relative to the gate word line, resulting in a relatively small contact area, and a relatively high contact resistance between the interconnecting structure and the gate word line.

Referring to FIG. 1, various embodiments of the present disclosure provide a method for manufacturing a semiconductor structure including the following operations.

At S10, a substrate is provided.

At S20, a gate trench is formed in the substrate. The gate trench includes a first trench and a second trench. The second trench is located above the first trench, communicates with the first trench, and has a width greater than a width of the first trench.

At S30, a gate word line is formed in the gate trench.

In the method for manufacturing the semiconductor structure of the embodiments of the present disclosure, the gate word line with a wider upper part can be obtained by preparing the gate trench with an upper part wider than a lower part. Since the gate word line has the wider upper part, it is convenient to align and contact the first interconnecting structure with the gate word line. Therefore, it can ensure that a sufficiently large contact area can be formed between the first interconnection structure and the gate word line, thereby reducing the contact resistance between the first interconnection structure and the gate word line, and improving electrical properties of the storage device to endow the storage device with higher read and write speed and storage efficiency.

Figure 2:
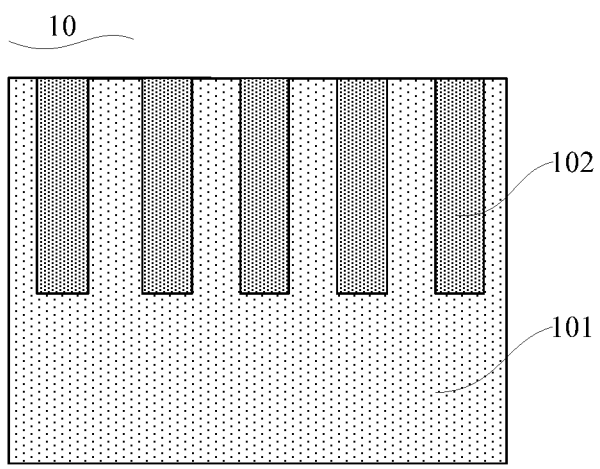
FIG. 2 schematically shows the cross section of an array region of a structure obtained at S10 in a method for manufacturing the semiconductor structure provided by an embodiment of the disclosure.

Referring to S10 in FIG. 1 and FIG. 2, the substrate 10 is provided at S10.

As an example, the substrate 10 may include, but is not limited to, a silicon substrate. The substrate 10 includes an active area 101 and an isolation structure 102.

Referring to S20 in FIG. 1 and FIG. 3 through FIG. 13B, a gate trench 103 is formed in the substrate 10 at S20. The gate trench 103 includes a first trench 1031 and a second trench 1032. The second trench 1032 is located above the first trench 1031, communicates with the first trench 1031, and has width greater than a width of the first trench 1031.

As an example, S20 may include the following operations.

Figure 3:
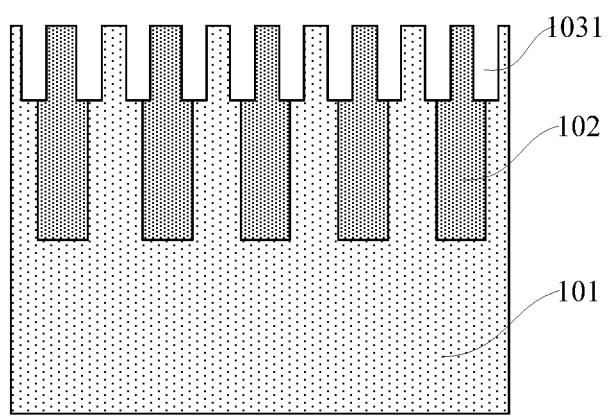
FIG. 3 schematically shows the cross section of an array region of a structure obtained after a first trench is formed in a method for manufacturing the semiconductor structure provided by an embodiment of the disclosure.

At S201, the first trench 1031 is formed in the substrate 10, as shown in FIG. 3.

Figure 5:
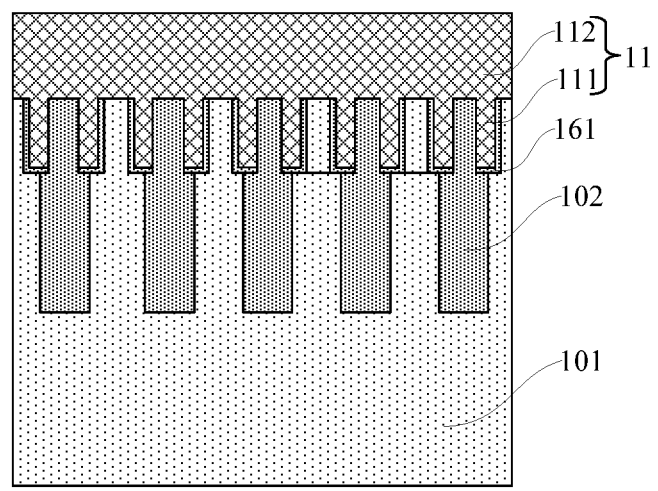
FIG. 5 schematically shows the cross section of an array region of a structure obtained after a sacrificial layer is formed in a method for manufacturing the semiconductor structure provided by an embodiment of the disclosure.

At S202, a sacrificial layer 11 is formed. The sacrificial layer 11 includes a first part 111 and a second part 112. The first trench 1031 is filled up by the first part 111. The second part 112 covers an upper surface of the substrate 10 and an upper surface of the first part 111, as shown in FIG. 5.

Figure 10:
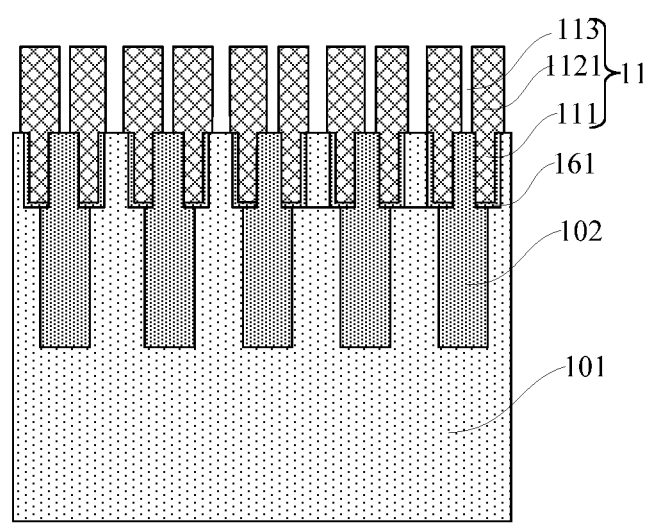
FIG. 10 schematically shows the cross section of an array region of a structure obtained after an isolation groove is formed in a method for manufacturing the semiconductor structure provided by an embodiment of the disclosure.

At S203, an isolation groove 113 is formed in the second part 112 to form a sacrificial pattern 1121 by patterning the second part 112. The sacrificial pattern 1121 is arranged to correspond to the first part 111, and has a width greater than a width of the first part 111, as shown in FIG. 10.

Figure 12:
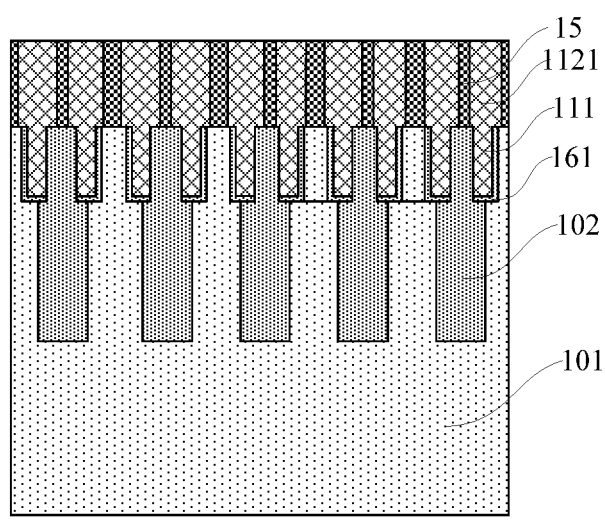
FIG. 12 schematically shows the cross section of an array region of a structure obtained after a filling layer is formed in a method for manufacturing the semiconductor structure provided by an embodiment of the disclosure.

At S204, a filling layer 15 is formed in the isolation groove 113. The isolation groove 113 is filled up by the filling layer 15, as shown in FIG. 12.

At S205, the sacrificial pattern 1121 is removed to form the second trench 1032.

Figure 13A:
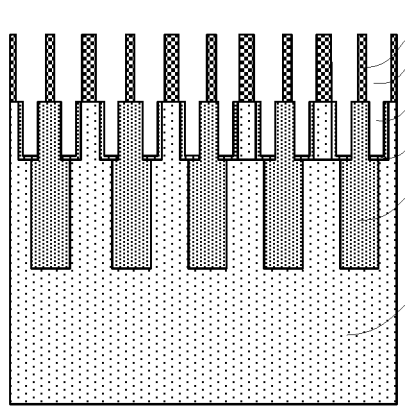
FIG. 13A schematically shows the cross section of an array region of a structure obtained after a filling layer is formed in a method for manufacturing the semiconductor structure provided by an embodiment of the disclosure.
Figure 13B:
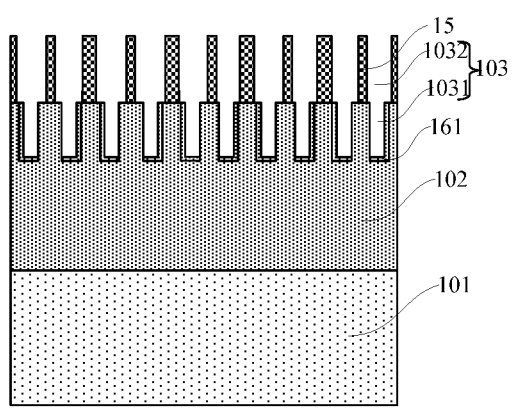
FIG. 13B schematically shows the cross section of an edge region of a structure obtained after a filling layer is formed in a method for manufacturing the semiconductor structure provided by an embodiment of the disclosure.

At S206, the first part 111 is removed, as shown in FIG. 13A and FIG. 13B.

Figure 4:
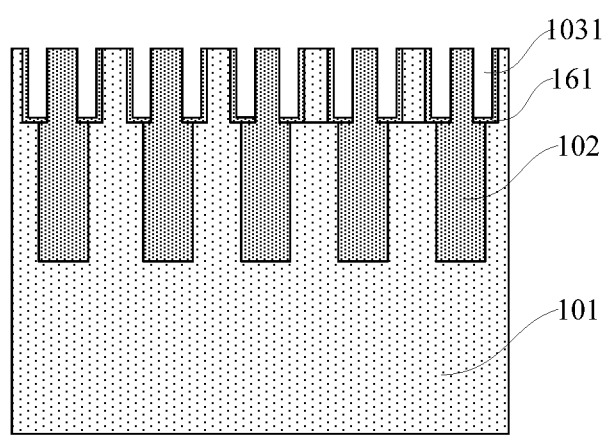
FIG. 4 schematically shows the cross section of an array region of a structure obtained after a first oxide layer is formed in a method for manufacturing the semiconductor structure provided by an embodiment of the disclosure.

As an example, the method may include the following operations between S201 and S202. A first oxide layer 161 is formed at a side wall of the first trench 1031, as shown in FIG. 4. Specifically, the first oxide layer 161 may be formed by using, but not limited to, a thermal oxidization process.

As an example, the sacrificial layer 11 formed at S202 may include, but is not limited to, a titanium nitride layer.

As an example, at S203, self-aligned dual imaging patterning (SADP) may be used to form the isolation groove 113 in the second part 112. Specifically, S203 may include the following operations.

At S2031, a mask layer 12 is formed on the sacrificial layer 11. The mask layer 12 includes a first hard mask layer 121, an organic sacrificial layer 122, and a second hard mask layer 123 that are sequentially stacked from bottom to top. The first hard mask layer 121 may include, but is not limited to, a silicon oxynitride layer. The organic sacrificial layer 122 may include, but is not limited to, a spin-coated organic carbon layer. The second hard mask layer 123 may include, but is not limited to, a silicon oxynitride layer.

Figure 6:
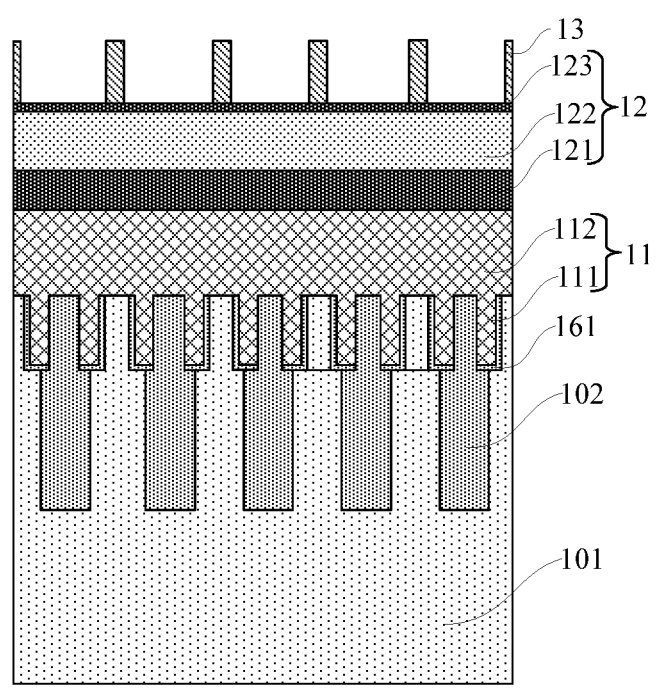
FIG. 6 schematically shows a first cross section of an array region of a structure obtained after a sacrificial pattern is formed in a method for manufacturing the semiconductor structure provided by an embodiment of the disclosure.

At S2032, a patterned photoresist layer 13 is formed on the mask layer 12. The patterned photoresist layer 13 delimits a position and shape of the sacrificial pattern, as shown in FIG. 6.

Figure 7:
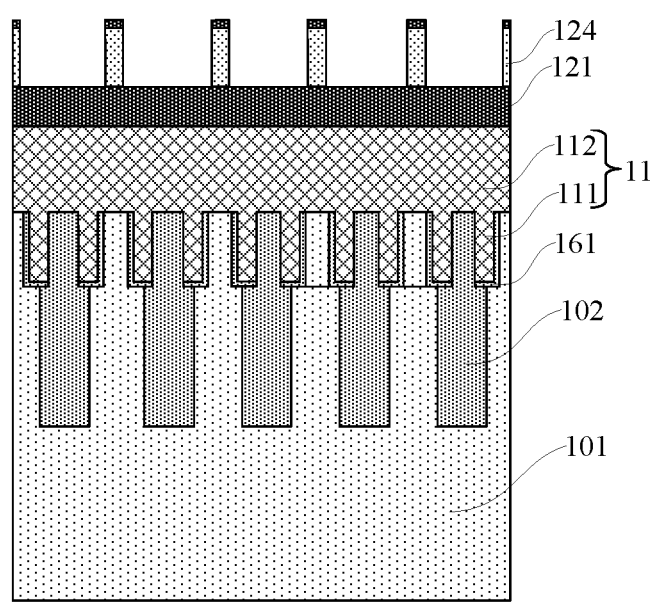
FIG. 7 schematically shows a second cross section of an array region of a structure obtained after a sacrificial pattern is formed in a method for manufacturing the semiconductor structure provided by an embodiment of the disclosure.

At S2033, the second hard mask layer 123 and the organic sacrificial layer 122 are etched based on the patterned photoresist layer 13, and the patterned photoresist layer 13 is removed to obtain an organic sacrificial pattern 124, as shown in FIG. 7.

Figure 8:
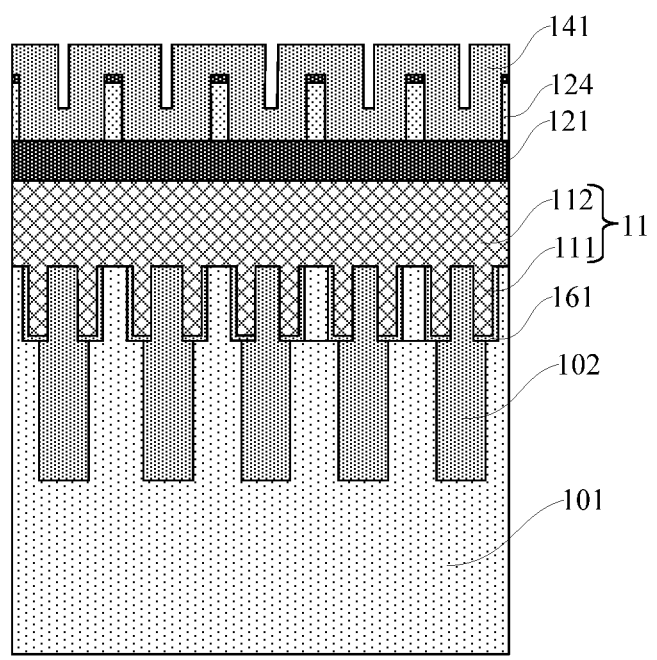
FIG. 8 schematically shows the cross section of an array region of a structure obtained after a side wall material layer is formed in a method for manufacturing the semiconductor structure provided by an embodiment of the disclosure.

At S2034, a side wall material layer 141 is formed on a side wall and a bottom of the organic sacrificial pattern 124 and a surface of an exposed part of the first hard mask layer 121, as shown in FIG. 8. The side wall material layer 141 may include, but is not limited to, a silicon oxide layer. The side wall material layer 141 may be formed by using, but not limited to, an atomic layer deposition process.

Figure 9:
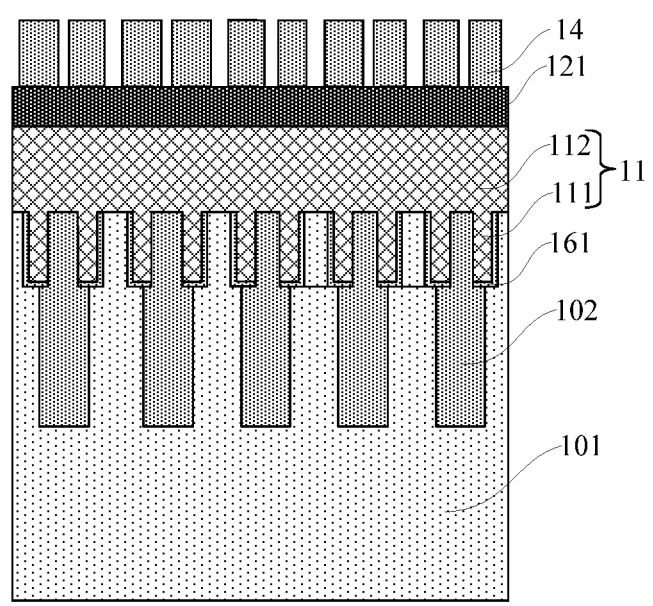
FIG. 9 schematically shows the cross section of an array region of a structure obtained after a side wall pattern is formed in a method for manufacturing the semiconductor structure provided by an embodiment of the disclosure.

At S2035, the side wall material layer 141 is removed from a top of the organic sacrificial pattern 124 and the surface of the exposed part of the first hard mask layer 121, and the organic sacrificial pattern 124 is removed to obtain the side wall pattern 14, as shown in FIG. 9.

At S2036, the first hard mask layer 121 and the second part 112 are etched based on the side wall pattern 14, the side wall pattern 14 and the remaining first hard mask layer 121 are removed to form the isolation groove 113 in the second part 112 to form the sacrificial pattern 1121 by patterning the second part 112, as shown in FIG. 10.

As an example, S204 may include the following operations.

Figure 11:
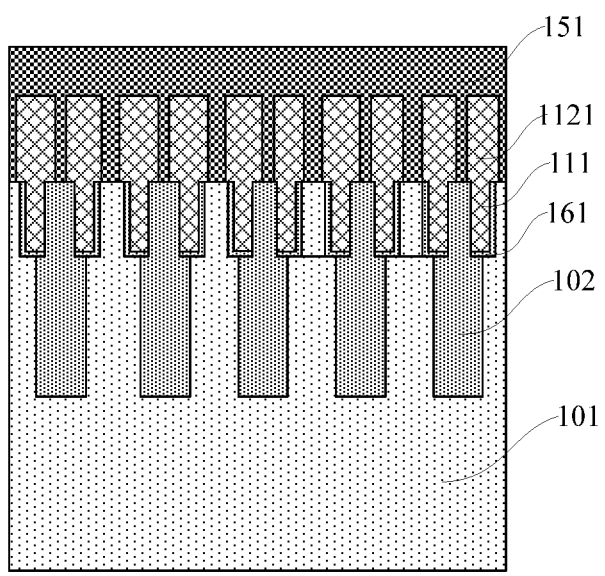
FIG. 11 schematically shows the cross section of an array region of a structure obtained after a filling material layer is formed in a method for manufacturing the semiconductor structure provided by an embodiment of the disclosure.

At S2041, a filling material layer 151 is formed in the isolation groove 113 and on the sacrificial pattern 1121, as shown in FIG. 11.

At S2042, the filling material layer 151 is removed from the sacrificial pattern 1121, as shown in FIG. 12.

As an example, an upper surface of the filling layer 15 may be flush with an upper surface of the sacrificial pattern 1121.

As an example, the filling layer 15 may include a silicon layer or a germanium layer or a silicon germanium layer grown by an epitaxial method.

As an example, after S20, the method further includes that the filling layer 15 is subjected with thermal treatment to form a second oxide layer 162 on the surface of the filling layer 15. As shown in FIG. 14A and FIG. 14B, the second oxide layer 162 and the first oxide layer 161 are seamlessly connected on the surface of the gate trench 103. Specifically, the silicon layer or germanium layer or silicon germanium layer grown by the epitaxial method may be used as a source or drain of the active area, and the second oxide layer 162 and the first oxide layer 161 may be used as gate oxide layers. The problem of high difficulty in fabrication of forming a gate trench with a relatively large depth-to-width ratio at one time can be avoided by separately fabricating the first trench 1031 and the second trench 1032.

Referring to S30 in FIG. 1 and FIG. 15A through FIG. 18B, a gate word line 16 is formed in the gate trench 103 at S30.

As an example, the substrate 10 includes an array region and an edge region located at a periphery of the array region, and the gate word line 16 is located in the array region and the edge region. FIGS. 15A, 16A, 17A, and 18A are schematic sectional structural diagrams of the array region, and FIGS. 15B, 16B, 17B, and 18B are schematic sectional structural diagrams of the edge region. The gate word line 16 in the edge region is located in the isolation structure 102.

As an example, S30 may include the following operations.

Figure 15A:
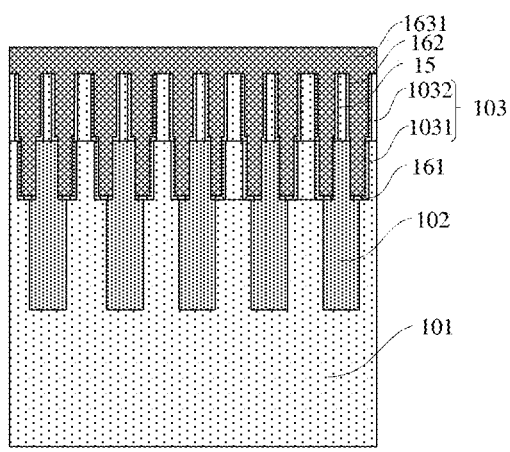
FIG. 15A schematically shows the cross section of an array region a structure obtained after a conductive material layer is formed in a method for manufacturing the semiconductor structure provided by an embodiment of the disclosure.
Figure 15B:
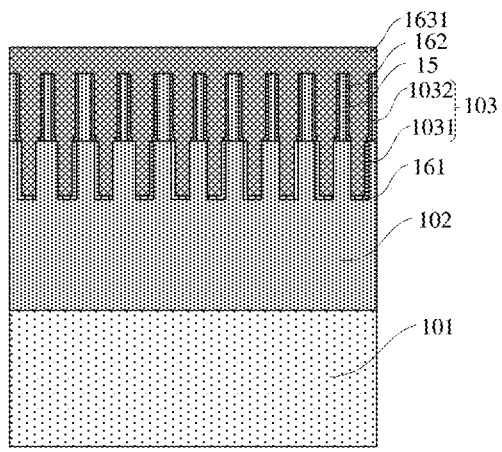
FIG. 15B schematically shows the cross section of an edge region a structure obtained after a conductive material layer is formed in a method for manufacturing the semiconductor structure provided by an embodiment of the disclosure.
Figures 16A, 16B:
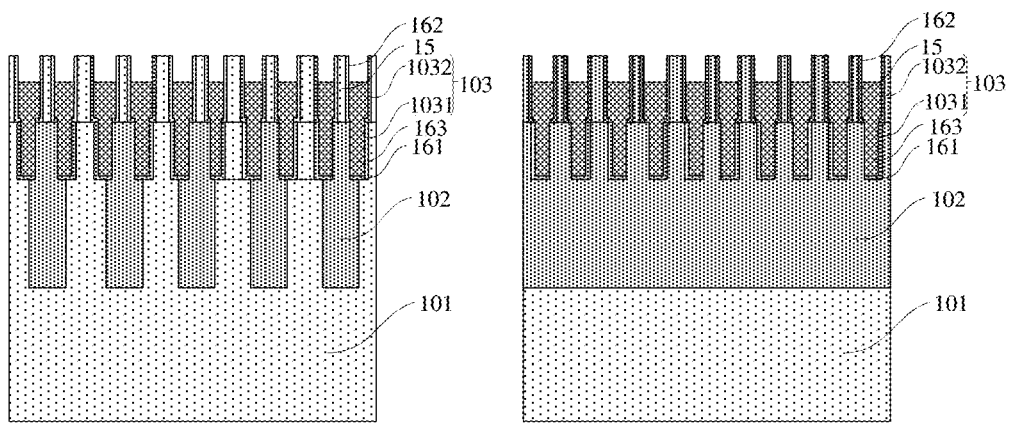
FIG. 16A schematically shows the cross section of an array region of a structure obtained after a word line conductive layer is formed in a method for manufacturing the semiconductor structure provided by an embodiment of the disclosure.
FIG. 16B schematically shows the cross section of an edge region of a structure obtained after a word line conductive layer is formed in a method for manufacturing the semiconductor structure provided by an embodiment of the disclosure.

At S301, a word line conductive layer 163 is formed in the gate trench 103. The first trench 1031 is filled up by the word line conductive layer 163 which extends into the second trench 1032. Specifically, a conductive material layer 1631 may be formed in the gate trench 103 and on the surface of the filling layer 15 first, as shown in FIG. 15A and FIG. 15B. Then, the conductive material layer 1631 is etched back to remove the conductive material layer 1631 on the surface of the filling layer 15 and part of the conductive material layer 1631 located in the second trench 1032, as shown in FIG. 16A and FIG. 16B.

As an example, the word line conductive layer 163 may include, but is not limited to, a titanium nitride layer. The word line conductive layer 163 may also include a titanium nitride layer and a tungsten layer. In this situation, the titanium nitride layer covers surfaces of the first oxide layer 161 and the second oxide layer 162. The tungsten layer is located on a surface of the titanium nitride layer away from the first oxide layer 161 and the second oxide layer 162.

As an example, S30 further includes the following operations.

Figures 17A, 17B:
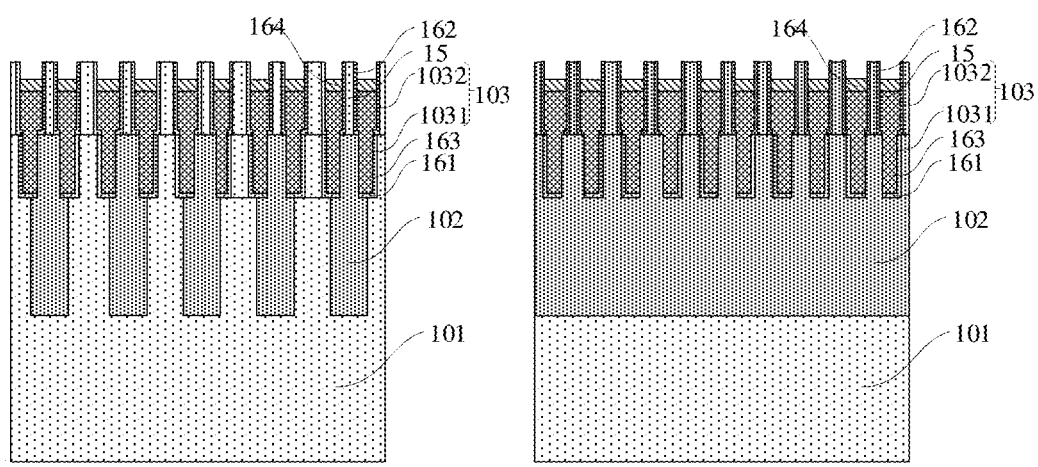
FIG. 17A schematically shows the cross section of an array region of a structure obtained after an auxiliary conductive layer is formed in a method for manufacturing the semiconductor structure provided by an embodiment of the disclosure.
FIG. 17B schematically shows the cross section of an edge region of a structure obtained after an auxiliary conductive layer is formed in a method for manufacturing the semiconductor structure provided by an embodiment of the disclosure.

At S302, an auxiliary conductive layer 164 is formed on an upper surface of the word line conductive layer 163, as shown in FIG. 17A and FIG. 17B. Specifically, the auxiliary conductive layer 164 may include a polycrystalline silicon layer. In the present embodiment, the auxiliary conductive layer 164 may include a doped polycrystalline silicon layer.

S30 also includes the following operations.

Figure 18A:
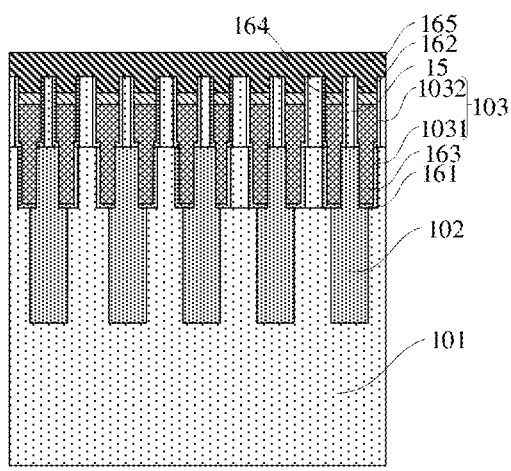
FIG. 18A schematically shows the cross section of an array region of a structure obtained after a dielectric cover layer is formed in a method for manufacturing the semiconductor structure provided by an embodiment of the disclosure.
Figure 18B:
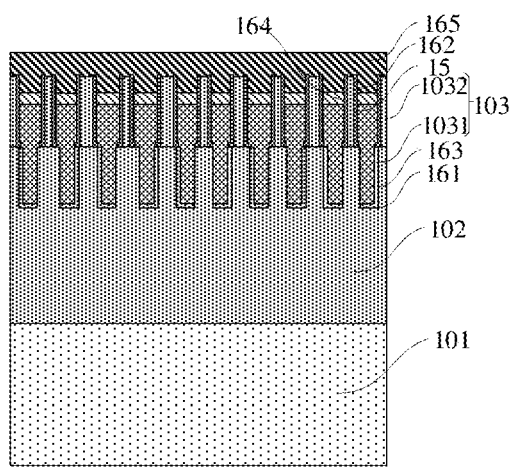
FIG. 18B schematically shows the cross section of an edge region of a structure obtained after a dielectric cover layer is formed in a method for manufacturing the semiconductor structure provided by an embodiment of the disclosure.

At S303, a dielectric cover layer 165 is formed on the auxiliary conductive layer 164. The second trench 1032 is filled up by the dielectric cover layer 165 which covers the surface of the filling layer 15, as shown in FIG. 18A and FIG. 18B. Specifically, the dielectric cover layer 165 may include, but is not limited to, a silicon nitride layer.

As an example, after S30, the method further includes the following operations.

At S50, a top dielectric layer 17 is formed on the substrate 10. The top dielectric layer 17 covers the array region and the edge region.

At S60, a first interconnection structure 201 is formed in the top dielectric layer 17 on the edge region. The first interconnection structure 201 penetrates through the top dielectric layer 17, and electrically connects with the word line conductive layer 163, as shown in FIG. 19.

As an example, the method further includes the following operations between S30 and S50.

Figure 19:
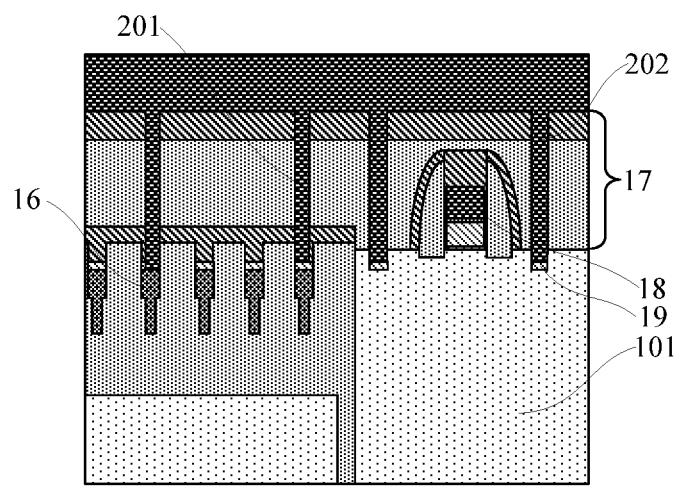
FIG. 19 schematically shows the cross section of an array region of a structure obtained after a first interconnection structure and a second interconnection structure are formed in a method for manufacturing the semiconductor structure provided by an embodiment of the disclosure.

At S40, a functional device 18 and a lead-out bonding pad 19 electrically connected to the functional device 18 are formed in the edge region, as shown in FIG. 19.

As an example, a second interconnection structure 202 is also formed in the top dielectric layer 17 while forming the first interconnection structure 201. The second interconnection structure 202 is connected to the lead-out bonding pad 19.

As an example, an upper surface of the auxiliary conductive layer 164 is flush with an upper surface of the lead-out bonding pad 19. The first interconnection structure 201 is connected to the auxiliary conductive layer 164. By arranging the auxiliary conductive layer 164, and making the upper surface of the auxiliary conductive layer 164 flush with the upper surface of the lead-out bonding pad 19, a height difference between the top of the gate word line 16 and the lead-out bonding pad 19 of the functional device 18 can be eliminated. The first interconnection structure 201 has the same depth as that of the second interconnection structure 202, which can reduce the scattering of plasmas generated during the etching, thereby facilitating the realization of etching alignment. Therefore, the first interconnection structure 201 will not be offset compared to the gate word line 16, which can ensure that the first interconnection structure 16 has a sufficiently large contact area with the gate word line, thereby further reducing the contact resistance between the first interconnection structure and the gate word line, and further improving the electrical properties of a storage device to endow the storage device with higher read and write speed and storage efficiency. In this way, the use of a composite gate structure composed of the word line conductive layer 163 and the auxiliary conductive layer 164 is beneficial to improve the gate induced drain leakage (GIDL) effect and further improve the performance of the storage device.

As an example, the top dielectric layer 17 may have a single-layer structure or a stacked structure including a plurality of layers of dielectric layers. In FIG. 19, it shows the top dielectric layer 17 being a laminated structure including a plurality of layers of dielectric layers. The specific top dielectric layer 17 may include an oxide layer and a silicon nitride layer located on an upper surface of the oxide layer.

Continuing to refer to FIG. 18A, FIG. 18B, and FIG. 19 in conjunction with FIG. 2 to FIG. 17B, the embodiment of the present disclosure further provides a semiconductor structure including a substrate 10, a gate trench 103, and a gate word line 16. The gate trench 103 is located in the substrate 10, and includes a first trench 1031 and a second trench 1032. The second trench 1032 is located above the first trench 1031 and communicates with the first trench 1031. A width of the second trench 1032 is greater than a width of the first trench 1031. The gate word line 16 is located in the gate trench 103.

In the embodiment of the present disclosure, the semiconductor structure obtained has the gate word line 16 with a wider upper part by preparing the gate trench 103 with an upper part wider than a lower part. Since the gate word line 16 has the wider upper part, it is convenient to align and contact the subsequently formed first interconnecting structure with the gate word line 16. Therefore, it can ensure that a sufficiently large contact area can be formed between the first interconnection structure and the gate word line 16, thereby reducing the contact resistance between the first interconnection structure and the gate word line 16 and improving electrical properties of a storage device to endow the storage device with higher read and write speed and storage efficiency.

As an example, the substrate 10 may include, but is not limited to, a silicon substrate. The substrate 10 includes an active area 101 and an isolation structure 102.

As an example, the substrate 10 further includes a filling layer 15, and the second trench 1032 is located in the filling layer 15.

As an example, a material of the filling layer 15 may include any one of silicon, germanium, or silicon germanium. Specifically, the filling layer 15 can be used as a source or a drain of the active area.

As an example, the gate word line 16 may include: a first oxide layer 161, a second oxide layer 162 and a word line conductive layer 163. The first oxide layer 161 is located on a side wall and a bottom of the first trench 1031. The second oxide layer 162 is located on a side wall of the second trench 1032. The first trench 1031 is filled up by the word line conductive layer 163 which extends into the second trench 1032.

As an example, the first oxide layer 161 and the second oxide layer 162 are formed by different processes, and are seamlessly connected on the side wall of the gate trench 103.

As an example, the word line conductive layer 163 may include, but is not limited to, a titanium nitride layer. The word line conductive layer 163 may also include a titanium nitride layer and a tungsten layer. In this way, the titanium nitride layer covers surfaces of the first oxide layer 161 and the second oxide layer 162. The tungsten layer is located on the surface of the titanium nitride layer away from the first oxide layer 161 and the second oxide layer 162.

As an example, an upper surface of the word line conductive layer 163 is located lower than an upper surface of the second trench. The gate word line 16 further includes an auxiliary conductive layer 164. The auxiliary conductive layer 164 is located on the word line conductive layer 163, and the auxiliary conductive layer 164 may include a polycrystalline silicon layer. In the present embodiment, the auxiliary conductive layer 164 may include a doped polycrystalline silicon layer. The upper surface of the auxiliary conductive layer 164 is located lower than a top surface of the gate trench 103.

As an example, the gate word line 163 further includes a dielectric cover layer 165. The second trench 1032 is filled up by the dielectric cover layer 165 which covers the surface of the filling layer 15, as shown in FIG. 18A and FIG. 18B. Specifically, the dielectric cover layer 165 may include, but is not limited to, a silicon nitride layer.

As an example, the substrate 10 includes an array region and an edge region located at a periphery of the array region. The gate word line 16 is located in the array region and the edge region. The semiconductor structure further includes: a top dielectric layer 17 that covers the array region and the edge region, a first interconnection structure 201 located in the top dielectric layer 17 on the array region, and penetrating through the top dielectric layer 17 to electrically connect with the word line conductive layer 163.

As an example, the gate word line 16 in the edge region is located in the isolation structure 102.

As an example, the semiconductor structure further includes a second interconnection structure 202. The second interconnection structure 202 is located in the top dielectric layer 17 on the edge region, and is connected to the lead-out bonding pad 19.

As an example, the semiconductor structure further includes a functional device 18 and a lead-out bonding pad 19. The functional device 18 is located in the edge region, and the lead-out bonding pad 19 is electrically connected to the functional device 18. The upper surface of the auxiliary conductive layer 164 is flush with the upper surface of the lead-out bonding pad 19, and is connected to the first interconnection structure 201. By arranging the auxiliary conductive layer 164, and making the upper surface of the auxiliary conductive layer 164 flush with the upper surface of the lead-out bonding pad 19, a height difference between the top of the gate word line 16 and the lead-out bonding pad 19 of the functional device 18 can be eliminated. The first interconnection structure 201 has the same depth as that of the second interconnection structure 202, which can reduce the scattering of plasmas generated during the etching, thereby facilitating the realization of etching alignment. Therefore, the first interconnection structure 201 will not be offset compared to the gate word line 16, which can ensure that the first interconnection structure 16 has a sufficiently large contact area with the gate word line, thereby further reducing the contact resistance between the first interconnection structure and the gate word line, and further improving the electrical properties of a storage device to endow storage device with higher read and write speed and storage efficiency. In this way, the use of a composite gate structure composed of the word line conductive layer 163 and the auxiliary conductive layer 164 is beneficial to improve the gate induced drain leakage (GIDL) effect and further improve the performance of the storage device.

The technical features of the embodiments described above can be arbitrarily combined. In order to make the description concise, all possible combinations of various technical features in the above embodiments are not completely described. However, the combinations of these technical features should be considered as the scope described in the present specification as long as there is no contradiction in them.

The foregoing embodiments represent only a few implementation modes of the present application, and the descriptions are specific and detailed, but should not be construed as limiting the scope of the present application. It should be noted that those of ordinary skill in the art may further make variations and improvements without departing from the conception of the present application, and these variations and improvements all fall within the protection scope of the present application. Therefore, the protection scope of the present application should be subject to the appended claims.

What is claimed is:

1. A method for manufacturing a semiconductor structure, comprising:
   providing a substrate;
   forming a gate trench in the substrate, the gate trench including a first trench and a second trench, the second trench being located above the first trench, communicating with the first trench, having a width greater than a width of the first trench; and
   forming a gate word line in the gate trench;
   wherein
   the forming the gate trench in the substrate comprises:
   forming the first trench in the substrate;
   forming a sacrificial layer, wherein the sacrificial layer comprises a first part and a second part, the first trench is filled up by the first part, and the second part covers an upper surface of the substrate and an upper surface of the first part;
   forming an isolation groove in the second part to form a sacrificial pattern by patterning the second part, wherein the sacrificial pattern is arranged to correspond to the first part, and has a width greater than a width of the first part;
   forming a filling layer in the isolation groove, wherein the isolation groove is filled up by with the filling layer;
   removing the sacrificial pattern to form the second trench; and
   removing the first part;
   wherein
   the filling layer comprises a silicon layer or a germanium layer or a silicon germanium layer grown by an epitaxial method.

2. The method for manufacturing the semiconductor structure of claim 1, further comprising:
   subjecting the filling layer with thermal treatment to form a second oxide layer on a surface of the filling layer.

3. The method for manufacturing the semiconductor structure of claim 2, further comprising:
   forming a first oxide layer on a side wall of the first trench, wherein the first oxide layer and the second oxide layer are seamlessly connected on a surface of the gate trench.

4. The method for manufacturing the semiconductor structure of claim 3, wherein
   the forming the gate word line in the gate trench comprises:
   forming a word line conductive layer in the gate trench, wherein the first trench is filled up by the word line conductive layer which extends into the second trench.

5. The method for manufacturing the semiconductor structure of claim 1, wherein
   the substrate comprises an array region and an edge region located at a periphery of the array region; the gate word line is located in the array region and the edge region;
   the method further comprising: after forming the gate word line, forming a top dielectric layer on the substrate, wherein the top dielectric layer covers the array region and the edge region;
   forming a first interconnection structure in the top dielectric layer on the edge region, wherein the first interconnection structure penetrates through the top dielectric layer, and electrically connects with the word line conductive layer.

6. The method for manufacturing the semiconductor structure of claim 5, wherein
   the substrate comprises an active area and an isolation structure;
   the gate word line in the edge region is located in the isolation structure.

7. The method for manufacturing the semiconductor structure of claim 6, further comprising:
   forming a functional device and a lead-out bonding pad electrically connected to the functional device in the edge region, prior to the forming the top dielectric layer on the substrate; wherein an upper surface of the word line conductive layer is located lower than the upper surface of the second trench;

forming an auxiliary conductive layer on the upper surface of the word line conductive layer, after the forming the word line conductive layer; wherein an upper surface of the auxiliary conductive layer is flush with an upper surface of the lead-out bonding pad, and the first interconnection structure is connected to the auxiliary conductive layer.

* * * * *